(12) United States Patent
Cap (10) Patent No.: US 7,249,805 B2
(45) Date of Patent: Jul. 31, 2007

(54) MOTION ACTIVATED POWER SOURCE

(75) Inventor: George Jaroslav Cap, Robertson (AU)

(73) Assignee: Kinergi Pty Ltd, Hawthorn (AU)

( * ) Notice: Subject to any disclaimer, the term of this patent is extended or adjusted under 35 U.S.C. 154(b) by 39 days.

(21) Appl. No.: 10/534,814

(22) PCT Filed: Nov. 17, 2003

(86) PCT No.: PCT/AU03/01523

§ 371 (c)(1),
(2), (4) Date: May 13, 2005

(87) PCT Pub. No.: WO2004/047281

PCT Pub. Date: Jun. 3, 2004

(65) Prior Publication Data

US 2006/0038465 A1    Feb. 23, 2006

(30) Foreign Application Priority Data

Nov. 18, 2002 (AU) ............... 2002952790

(51) Int. Cl.
*H01L 41/113* (2006.01)
(52) U.S. Cl. ..................... 301/339; 310/330
(58) Field of Classification Search ........... 310/328, 310/311, 330–332, 339
See application file for complete search history.

(56) References Cited

U.S. PATENT DOCUMENTS

| | | | |
|---|---|---|---|
| 3,457,463 A * | 7/1969 | Balamuth | 361/184 |
| 3,480,808 A | 11/1969 | Rieth | |
| 4,412,355 A | 10/1983 | Terbrack et al. | |
| 6,252,336 B1 * | 6/2001 | Hall | 310/339 |
| 6,433,465 B1 * | 8/2002 | McKnight et al. | 310/339 |
| 6,700,217 B1 * | 3/2004 | North et al. | 290/53 |

FOREIGN PATENT DOCUMENTS

| | | | |
|---|---|---|---|
| EP | 2264208 | * | 8/1993 |
| FR | 2478996 A | | 10/1981 |
| GB | 2264208 A | | 8/1993 |
| GB | 2326275 A | | 12/1998 |
| WO | WO 01/20760 A1 | | 3/2001 |

* cited by examiner

*Primary Examiner*—Thomas M. Dougherty
(74) *Attorney, Agent, or Firm*—Connolly Bove Lodge & Hutz LLP (57) ABSTRACT

An electrical generator or motion sensor including a) a pair of elongated L shaped supports (15) fixed at one end but free to move at the other b) a coil (14) secured to the supports remote from the fixed end c) an array of permanent magnets (12) arranged adjacent the coil such that movement of the coil through the magnetic field induces an electric current in the coil. To rectify the current the supports are made of a piezoelectric polymer membrane so that movement of the coil stresses the membrane to generate a voltage that is used to turn on a MOSFET transistor rectifier.

7 Claims, 13 Drawing Sheets

(a) Membrane (b) Membrane Flexing Components

FIG.13.

p = pivot r = rod

MOTION ACTIVATED POWER SOURCE

This invention relates to a magnetic based electric power source as a substitute for batteries and mains power connections, that draw on ambient vibrations or motion.

BACKGROUND TO THE INVENTION

For some time there has been interest in harvesting energy from vibrations or motion such as walking to provide power as a replacement for batteries. Two sources of electric power have been used previously piezoelectric devices and magnetic devices.

U.S. Pat. Nos. 4,412,355 and 4,471,353 disclose a switch that powers a transmitter to switch on a remote light using the current generated by a magnet on a vibrating reed interacting with a coil.

U.S. Pat. No. 5,818,132 generates electric power from the linear movement of a magnet through a coil U.S. Pat. No. 5,838,138 uses a sprung magnet on a key of a key board moving in a coil to generate electric power to recharge batteries on a portable computer or similar device.

U.S. Pat. No. 5,844,516 discloses a wireless remote controller, which replaces batteries with a piezo generator actuated by a push button or turning wheel.

U.S. Pat. No. 5,945,749 discloses a power generator for devices on a train which uses the motion of the train to oscillate a magnetic piston within a coil.

U.S. Pat. No. 6,220,719 provides a torch with a magnet able to reciprocate within the torch barrel which is wound with coils. The arrangement includes a capacitor for storing charge.

U.S. Pat. No. 6,291,901 discloses an automobile wheel with a magnet and coil arranged so that deflection of the tire causes relative motion between the magnet and the coil to generate electricity.

WO 01/20760 discloses a micro piezo generator comprising a micro fabricated silicon cantilever with a piezo layer on the cantilever so that vibration of the cantilever to generate current.

There is a need for a device which can generate electrical power without being actively actuated but which simply relies on the vibration or movement of the body or article to which it is attached.

BRIEF DESCRIPTION OF THE INVENTION

To this end the present invention provides an electrical generator which includes
  a) An elongated support fixed at one end but free to move or flex at the other
  b) a coil with electrical outputs secured to said elongated support remote from the fixed end
  c) A magnetic filed adjacent the coil such that movement of the coil in the magnetic field, induces an electric current.

An advantage of this invention resides in the fact that it is the coil that moves rather than a magnet. The coil provides the main inertial mass of the generator. Preferably the support is a thin reed and is L shaped so that the coil can be moved in two component directions. In one embodiment the membranes are made of stainless steel.

The magnetic field is provided by a permanent magnet or an array of permanent magnets. Preferably the magnetic flux is non linear and the permanent magnets are configured to maximize the magnetic flux over the path of the moving coil to maximize current generation.

The generator of this invention harvests the mechanical energy of motion and converts it into storable electrical energy. The device has a passive parasitic operation meaning that it converts energy without any active input, i.e. there are no buttons to push nor is there any required intentional shaking or direct activation of any kind. The device is parasitically attached to or placed into a receptacle that is attached to a moving object. For example the device may be placed in a trouser pocket, placed in a handbag or case, attached to an animal, tree, motor vehicle, ship, machine or any moving body.

The supports are preferably 'L' shaped membranes or reeds that can be set to vibrate by movement or vibration, but instead of a fixed membranes it may be a pivoted rod or membrane with the coil at the free end. The advantage of this arrangement lies in the possibility of inclusion of several pivots of different material type and thickness, which will have different resonant frequencies. This configuration will increase the 'harvesting bandwidth' of the invention. Each rod—pivot branch of the tree combination can be arranged to harvest at a different frequency. The operation of each of the 'branches' is the same as for a single membrane. A coil is fixed to each of the free ends of the branches; each of these coils is made to pass (as with the single membrane) through the field of a permanent magnet arrangement. And two of these trees are needed to support the coils on each branch.

As the coils pass through the field created by permanent magnets arranged around the coils they generate an AC voltage, which appears at the coil output wires. The voltage generated can be used to charge a capacitor or a battery. The invention may be used as a movement energy sensor. By attaching the invention to a moving object it can give an indication of movement intensity. This is because the AC voltage generated by the invention is proportional to how vigorously the object moves.

To make use of the AC voltage as a generator, the voltage needs to be converted to a DC current by a rectification circuit and then stored in a capacitor. In many applications, the voltage generated is not high. Preferably low voltage schottky diodes are used in the rectification circuit.

If a rod—pivot tree combination is utilised the outputs of each of the branches is rectified before connecting to the storage capacitor. In another embodiment the membranes, pivots (or reeds) are replaced with a piezo polymer membrane preferably polyvinylidenedifluoride (PVDF). The advantage of using this material is that any movement flexing the piezo material generates a voltage across the material, which is collected by the electrodes. This voltage is enough to turn on low input impedance transistors [MOSFET's], and they can be used to replace the diodes in the previous embodiment and actively rectify the induced voltage from the coils. This aspect of the invention is partly predicated on the discovery that the voltage generated by the piezo membrane and the voltage generated by the coils is in phase. Although the energy generated by the piezo strip is lower than that generated by the coils, the voltage is much higher and is sufficient to turn on the MOSFET's to rectify the AC voltage generated by the coils. The advantage over the previous embodiment is that without the piezo membrane the turn on voltage and/or current had to be provided by the coil generators to begin the rectification process. The piezo membranes supply the turn on voltage in this embodiment, as they are flexed in phase by the movement of the coils. This voltage when applied to the gates of the MOSFET transistors almost develops a condition of 'zero switching'. In practice this 'zero switching' actually occurs between 0.1 and 0.2 volts of the actual AC zero point, which translates to a significant increase in the harvesting efficiency when compared to standard diode turn on voltages of 0.6 to 1.2 volts.

Thus this invention in another aspect provides a rectification device for a parasitic energy harvester in which vibration or motion induces relative movement between a coil and a magnet to induce an electric current in the coil in which a piezo electric membrane is incorporated into the support for either the magnet and/or the coil so that the vibration or motion also produces a voltage in the piezoelectric membrane sufficient to power the rectification of the voltage produced by the relative movement between the coil and the magnet. This rectification means can be applied to any device where a magnet oscillates about a coil as in the prior art or where a coil oscillates in a magnetic field as in this invention.

The devices embodying this invention can be small, lightweight, and unobtrusive and yet generate sufficient electric energy to power sensor or alarm circuits and transmitters in applications where battery power is usually needed. This includes most remote sensing where motion or vibration is experienced as in land, air and water vehicles, buoys, animal tracking devices, pagers etc.

DETAILED DESCRIPTION OF THE INVENTION

A preferred embodiment of the invention will be described with reference to the drawings in which.

For the invention to function it must be parasitically attached to or placed into a receptacle that is rigidly attached to a moving object.

Parts 12, 21 & 13 are magnets and are held in place locally by parts 20, 18, 11, and 23.

The magnet parts 12 adhere by magnetic attraction to the main body part 11.

The magnets part 13 are fixed inside a hollow section of part 20 which is fitted on a spigot protrusion from the centre of parts 18.

Figure 3:
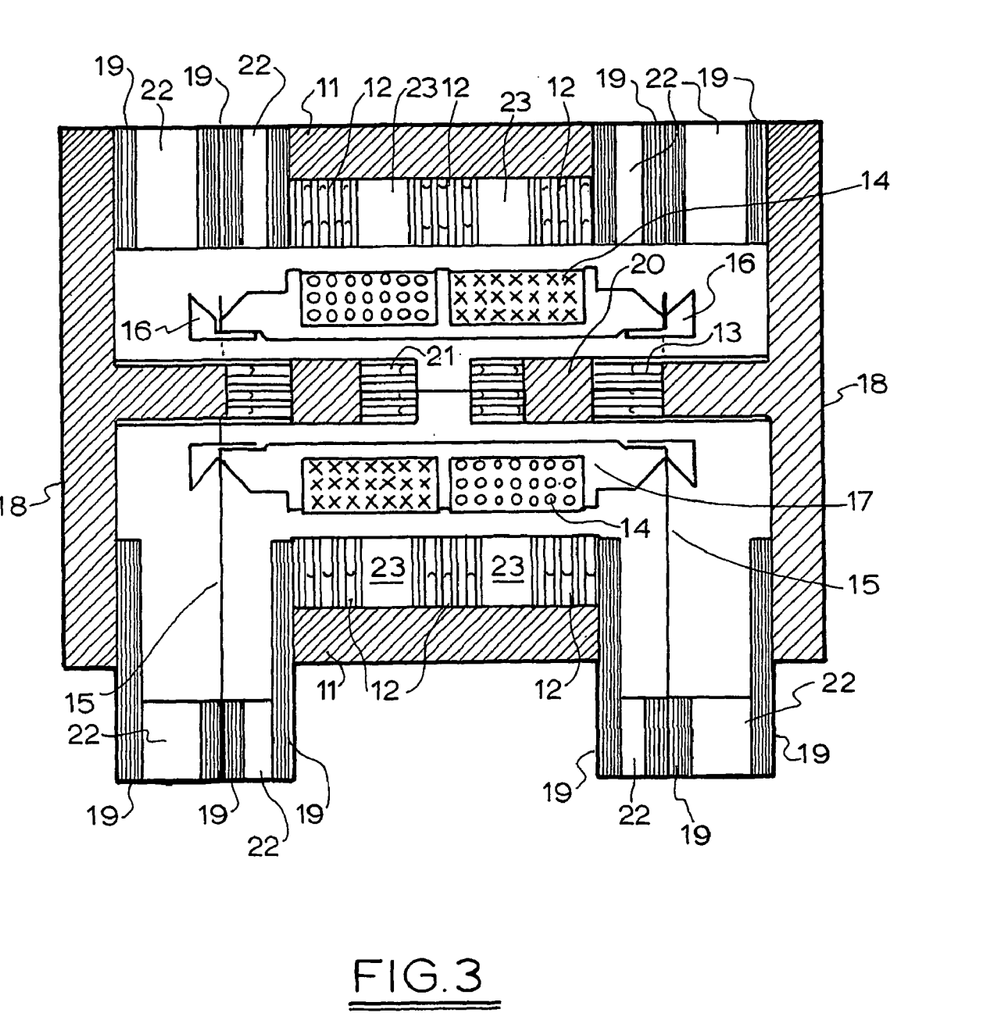
FIG. 3 shows the section plane of the shaded plane of FIG. 1.

The permanent magnets part 21 are fixed on top of the solid section of part 20. All magnets are placed with their North Pole in the direction of the arrows in FIG. 3. The placement and alignment of the magnets shown in FIG. 3 develop a strong non-linear magnetic flux density in the cavity between them.

Parts 15 are two stainless (or piezo) membranes that support the two coils (part 14) and the bobbin part 17 in the cavity between the magnets.

Parts 16 are hollow plug fixings that attach the membranes 16, to the bobbin body 17. Spacers 22 and printed circuit boards 19 fix the position and separate the membranes to the main body 11 and the outer body 18. Parts 18, 19, 22 and 15 are fixed to part 11 by two 1 inch×8 BA brass screws.

Figure 1:
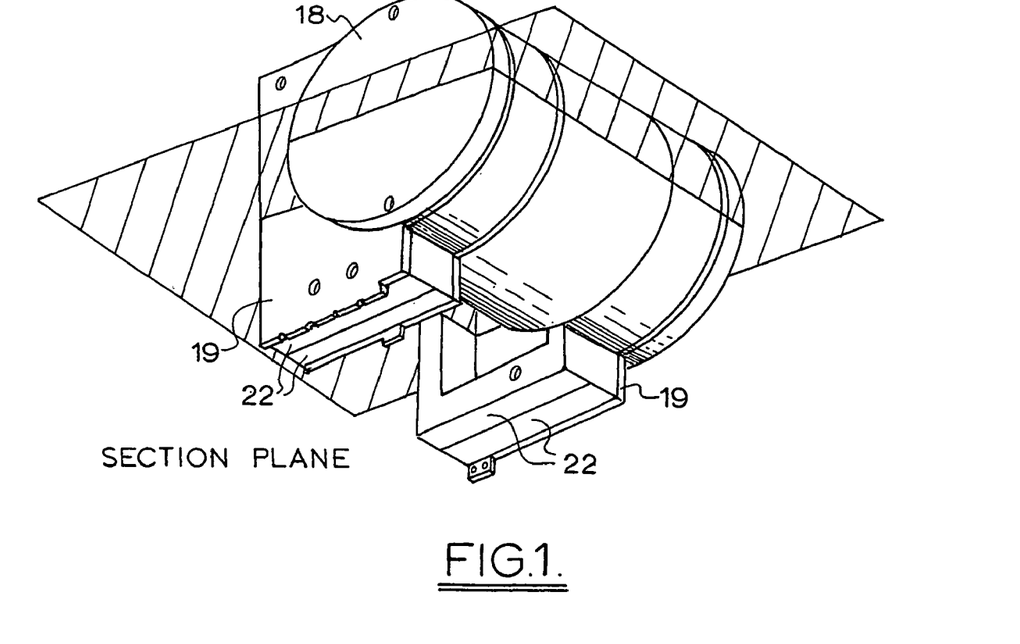
FIG. 1 shows a three-dimensional rendering of the mechanical assembly of the invention.
Figure 2:
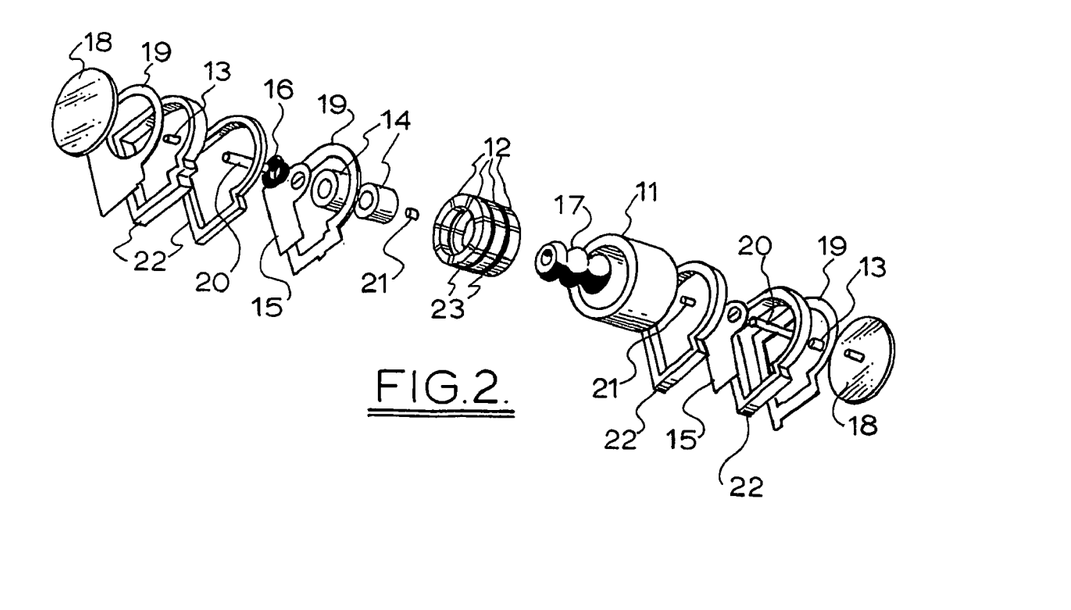
FIG. 2 is an exploded assembly of the first embodiment (with schottky diodes, see FIG. 5 for the electronic schematic) of the invention.
Figure 11:
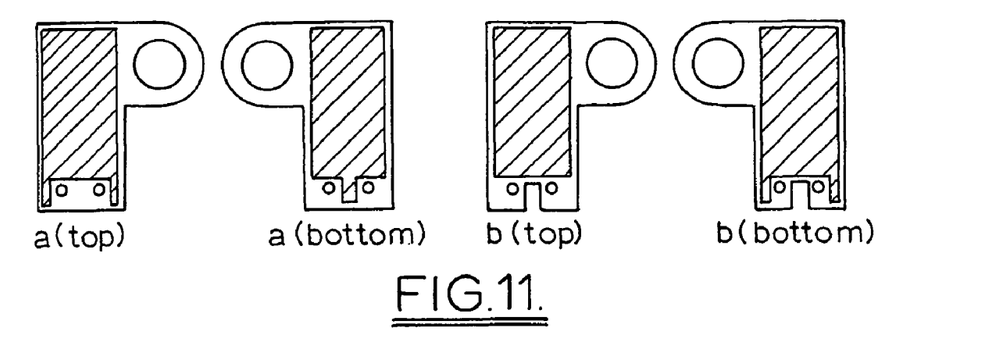
FIG. 11 is a drawing of the second embodiment PVDF membranes (clear) with the electrodes (in black)
Figure 12:
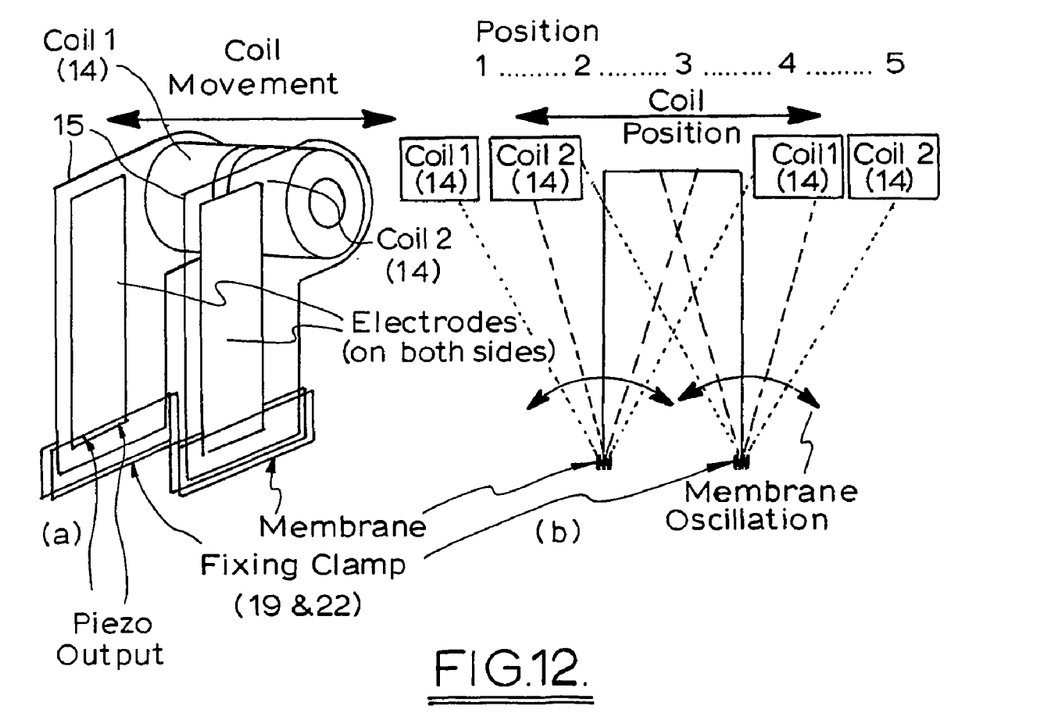
FIG. 12 is a drawing of the second embodiment coil position, suspension and motion (oscillation).
Figure 13:
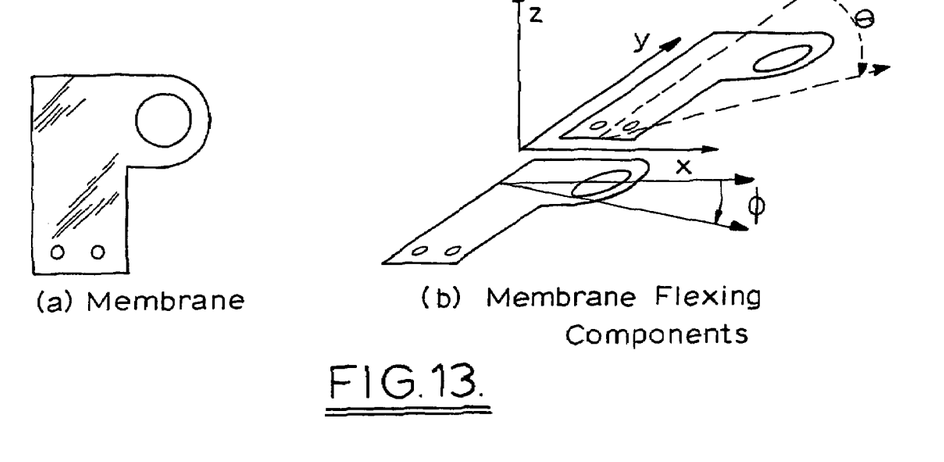
FIG. 13 is a drawing showing the flexing components of the membrane.
Figure 14:
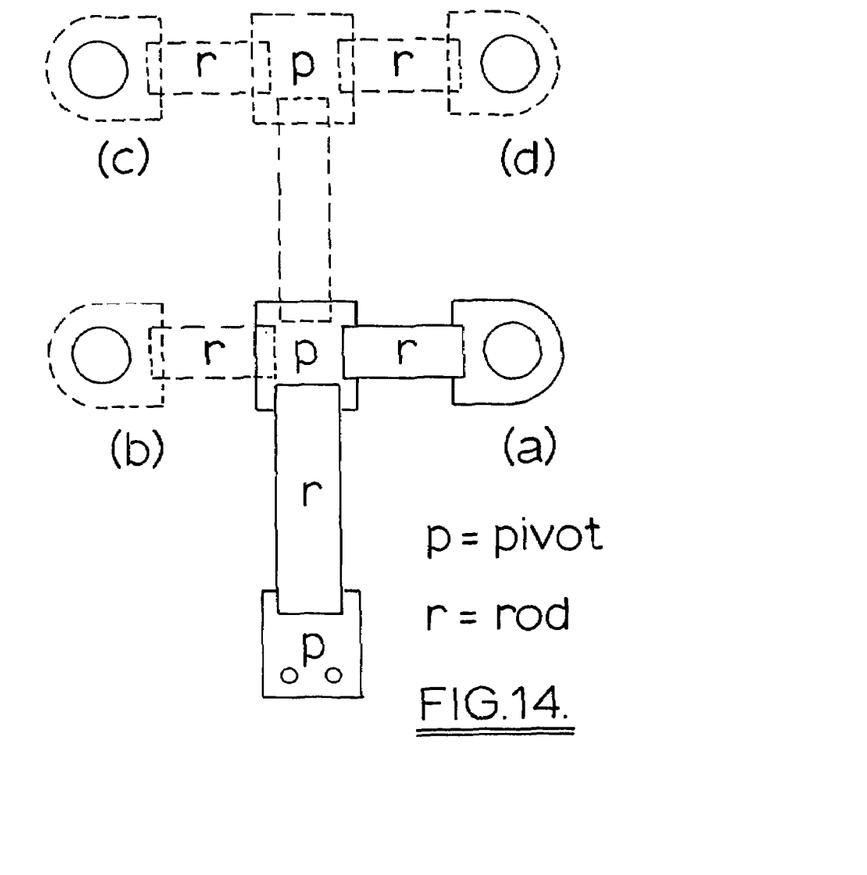
FIG. 14 is a drawing showing the rod and pivot 'tree' replacing the single membrane, enabling a larger harvesting bandwidth.
Figure 15:
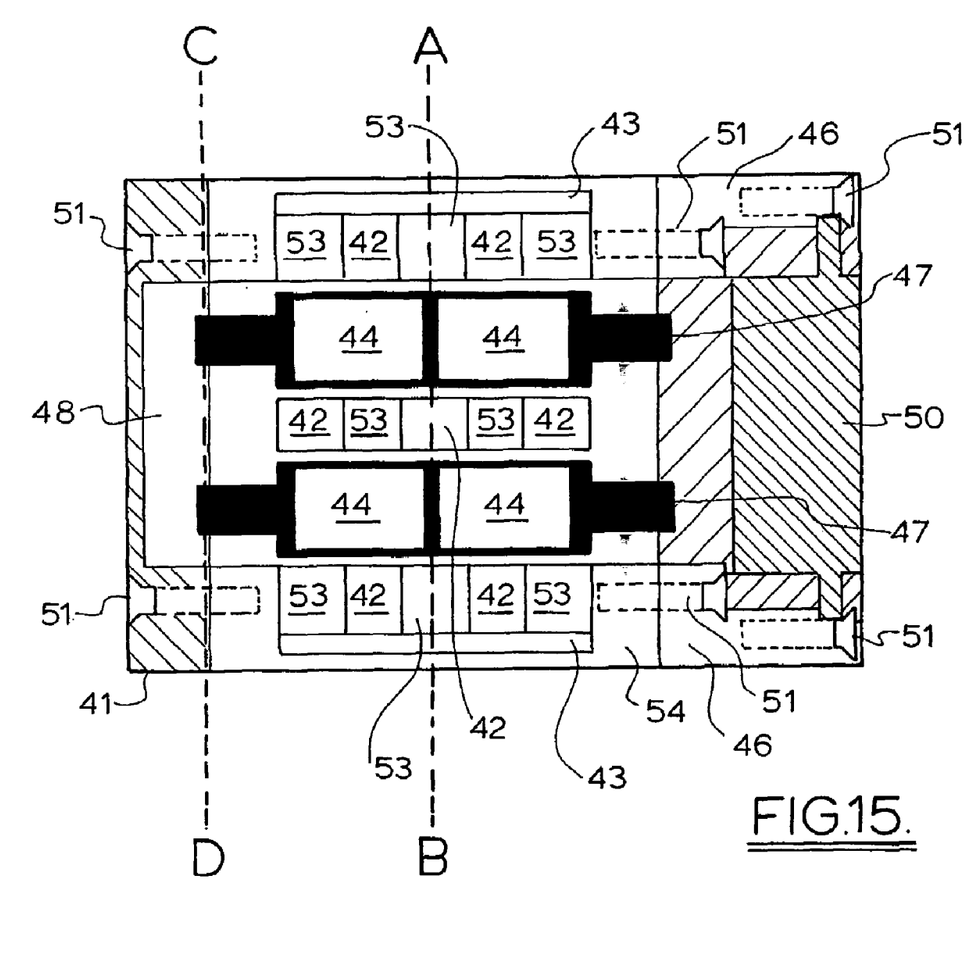
FIG. 15 shows a plan of the mechanical assembly of the next embodiment of the invention.
Figure 16:
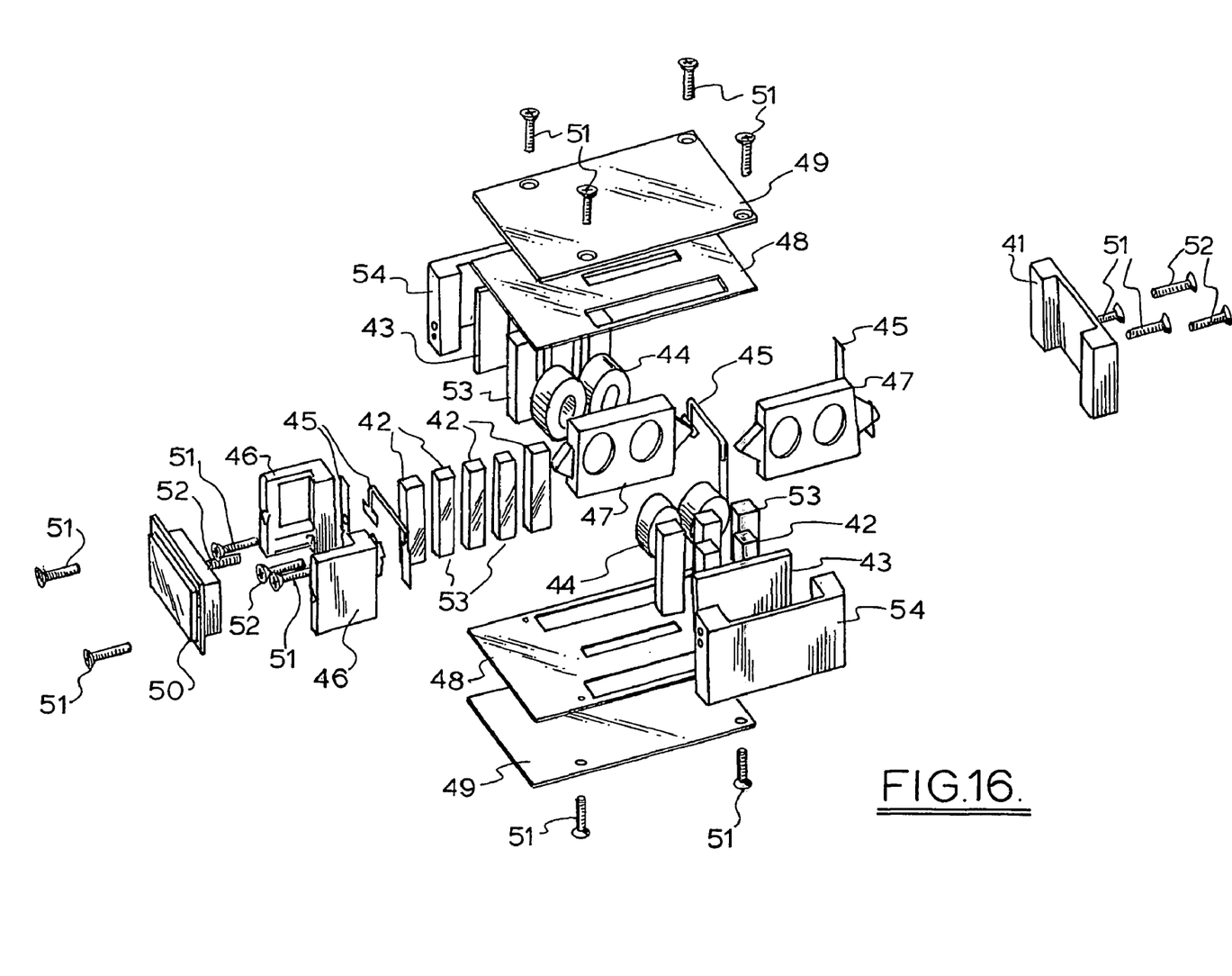
FIG. 16 is an exploded assembly of this embodiment of the invention.

Parasitic attachment to a moving object will force the device into random movement. The combined mass of the coils (parts 14), bobbin (17) and fixings (16) together with the membranes (15) act as a mass—spring network, which is set into oscillation (see FIG. 12) by the movement of the invention body. As this random movement may be in two of three component directions (see FIG. 13) signified in cartesian coordinate system by the symbols x, y, and z, the orientation of the mass spring network is very important for energy 'capture'. The membrane (15) has an 'L' shape (see FIG. 2 & FIG. 11) which allows energy capture in two directions x' and y' (see FIG. 13) which ensures alignment with at least one major movement direction for any placement.

A direct result of the oscillation of the coil (14), bobbin (17), fixings (16) and membranes (15) network as described above, is the oscillation of the coil in the cavity region permeated with the non-linear flux density. The interaction of the passage of the coil with the flux density produces an AC voltage in the coil. This voltage to be stored for later use must first be rectified into a DC voltage.

Figure 5:
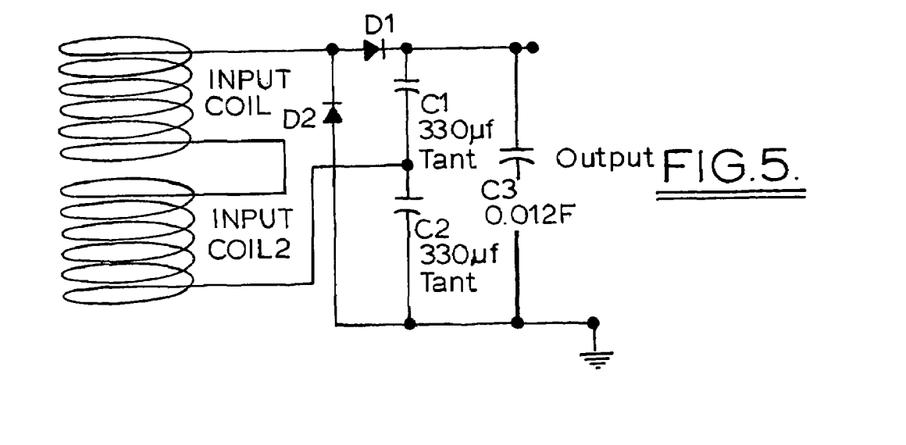
FIG. 5 is a schematic of the stainless steel membrane (first) embodiment electronic assembly.

This voltage is rectified by a shottky diode voltage doubler and then connected so that it can charge a capacitor, shown schematically in FIG. 5. The charge in the capacitor (C3) can be used as a battery replacement.

Figure 4:
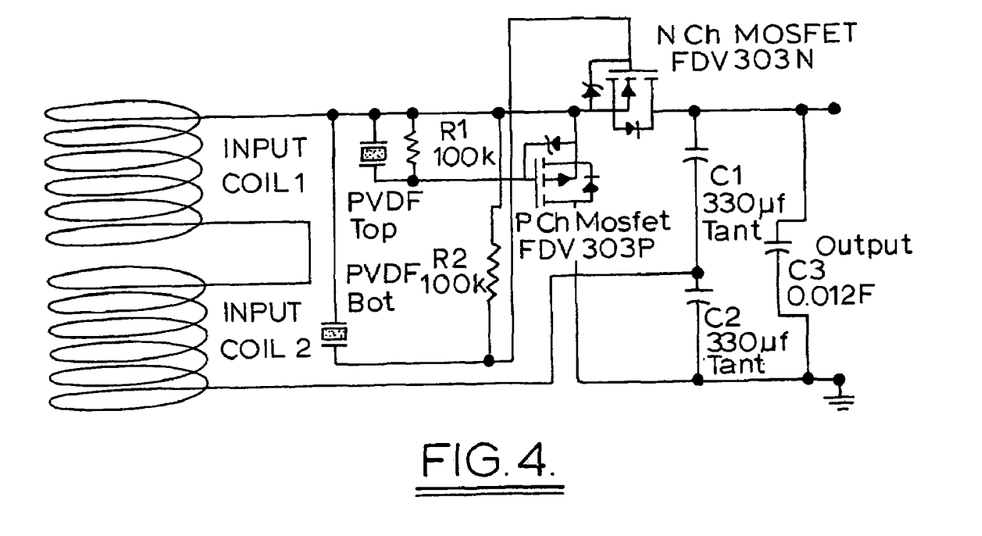
FIG. 4 is a schematic of the PVDF (Piezo) membrane (second) embodiment electronic assembly.

FIG. 4 is the electrical schematic of the next embodiment of the rectification circuit as an 'active' rectification circuit. The basic configuration is adopted from the voltage doubler circuit in FIG. 5 and the extracted energy is stored in the output capacitor (C3) as in FIG. 5. What is different is that the stainless steel membranes (15) are replaced with piezo membranes, and the voltage derived from the flexing of the piezo membranes is used to turn on MOSFET transistors. The voltage developed by the piezo membrane may be too large for the capability of the gate of the MOSFET transistor, and preferably it is needed to limit the voltage from the piezo membranes. The zener diodes incorporated in the MOSFET package do this (see FIG. 4) and this configuration also eliminates all problems with stray capacitance that would be associated with external components. Please note that this embodiment (see FIG. 4) will revert to the previous embodiment (see FIG. 5) if for any reason the piezo MOSFET switching circuit fails. Each MOSFET has an internal clamping diode designed to prevent back EMF destroying the device. If the gate of the MOSFET is not turned on, this type of MOSFET will revert to functioning as if it were a diode and the equivalent operating circuit will be as in FIG. 5. The benefit of this embodiment is that it is more efficient than the first embodiment.

Three extra electronic modules may be added to the device described above:

1. DC to DC switch mode voltage converter Module (see FIG. 6) During start-up operation of the device, energy begins to be stored in the capacitor C3 (see FIG. 6). Because of the large capacity of this capacitor (0.01 Farad) it may take some time (and therefore walking distance) to charge the device to useable voltage levels, even though the actual energy stored in the capacitor may be enough to drive the particular application. A switch mode step-up DC to DC voltage converter is used to convert the voltage to a useable level as required by the application. The supply current will decrease in proportion to the voltage increase, and there are losses in the efficiency (80%) and drive current (30 uA) of the converter.

Figure 6:
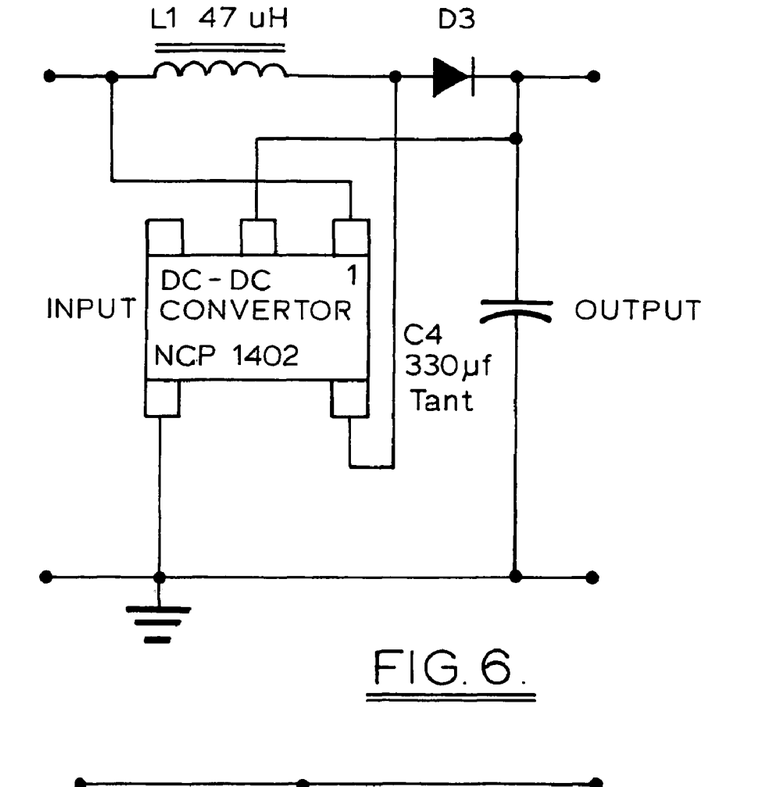
FIG. 6 is a schematic circuit diagram of the DC to DC switch mode voltage converter module used in a preferred embodiment of the invention

Typically the converter will start-up when the voltage in the capacitor C3 rises above 0.8 Volts. Once turned on the device will continue to operate until the voltage in C3 drops below 0.3 Volts.

This means that the device has drive capability as soon as the energy is available in the capacitor C3.

2. Voltage Detector Module (see FIG. 7)

Figure 7:
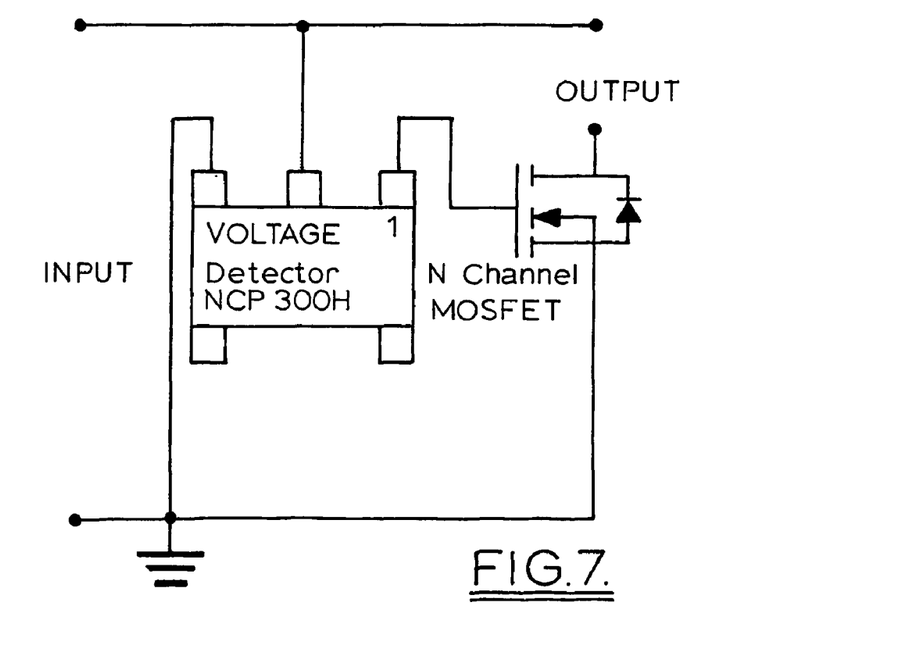
FIG. 7 is a schematic circuit diagram of the voltage detector module used in a preferred embodiment of this invention.

When batteries are connected to a circuit voltage instantly appears in the circuit and the circuit begins to function as expected. For energy harvesters the voltage appears in the circuit as it is generated. The output of the DC to DC converter when switching to the application voltage still rises in time to the required application voltage. This may cause problems when turning on some integrated circuits. This is because the voltage is not high enough and a 'partial turn on state' is initiated. This may occur where the circuit is output is close to the required voltage threshold but, continues to run the device by draining more and more current. This has the unfortunate result of draining all the charge from the storage capacitor C3 without turning on the application.

This problem is overcome using a voltage detector (see FIG. 7). The detector is set so that it senses when the output voltage of the DC to DC converter is at the application voltage. It then switches its output (pin 1) to this voltage (see FIG. 7). This output is used to turn on a MOSFET transistor which then switches on the output connection to the negative supply.

Figure 8:
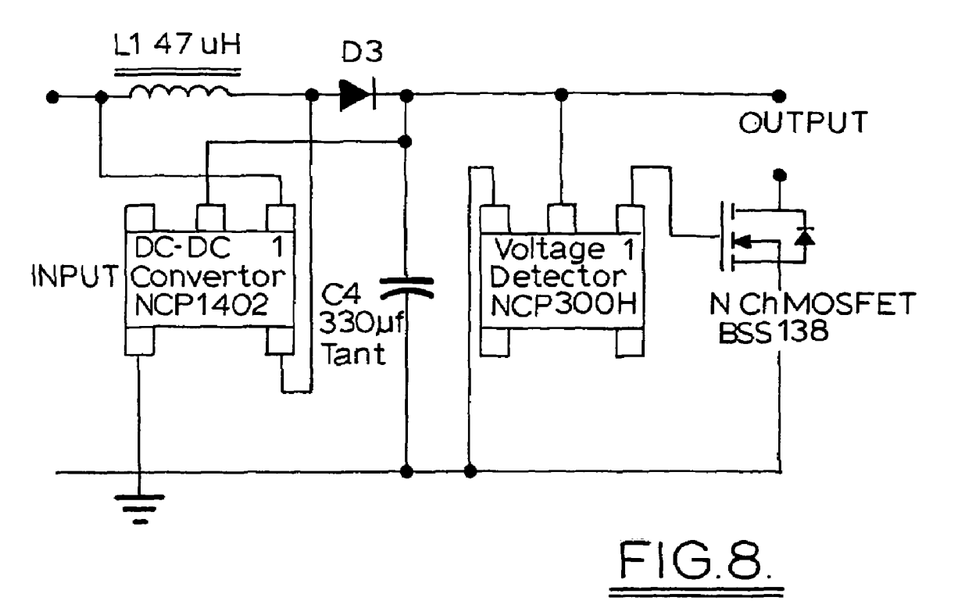
FIG. 8 is a schematic circuit diagram of the DC to DC converter and the voltage detector modules placed together.

This means that when the device is charged and ready to function it automatically turns itself on to drive the application and vice versa. The voltage detector circuit behaves as an automatic on/off switch. A schematic circuit of both modules together is shown in FIG. 8.

Figure 9:
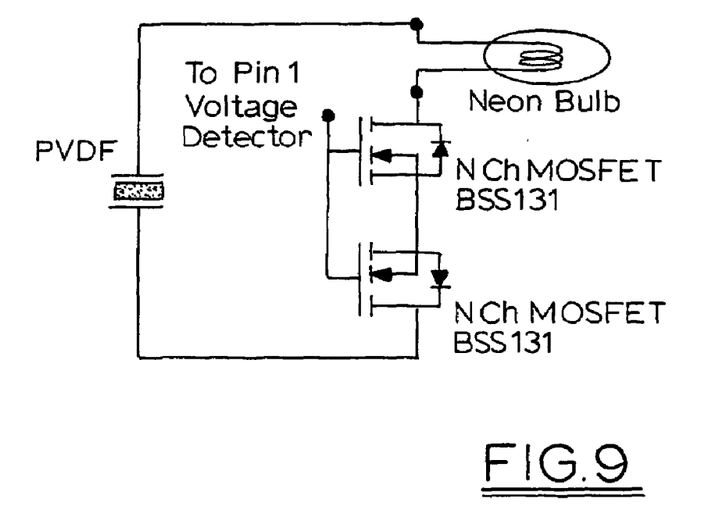
FIG. 9 is a schematic circuit diagram of the charge indicator circuit. This uses the other of the piezo membranes which is not used in rectification (in FIG. 4) to power a neon light.
Figure 10:
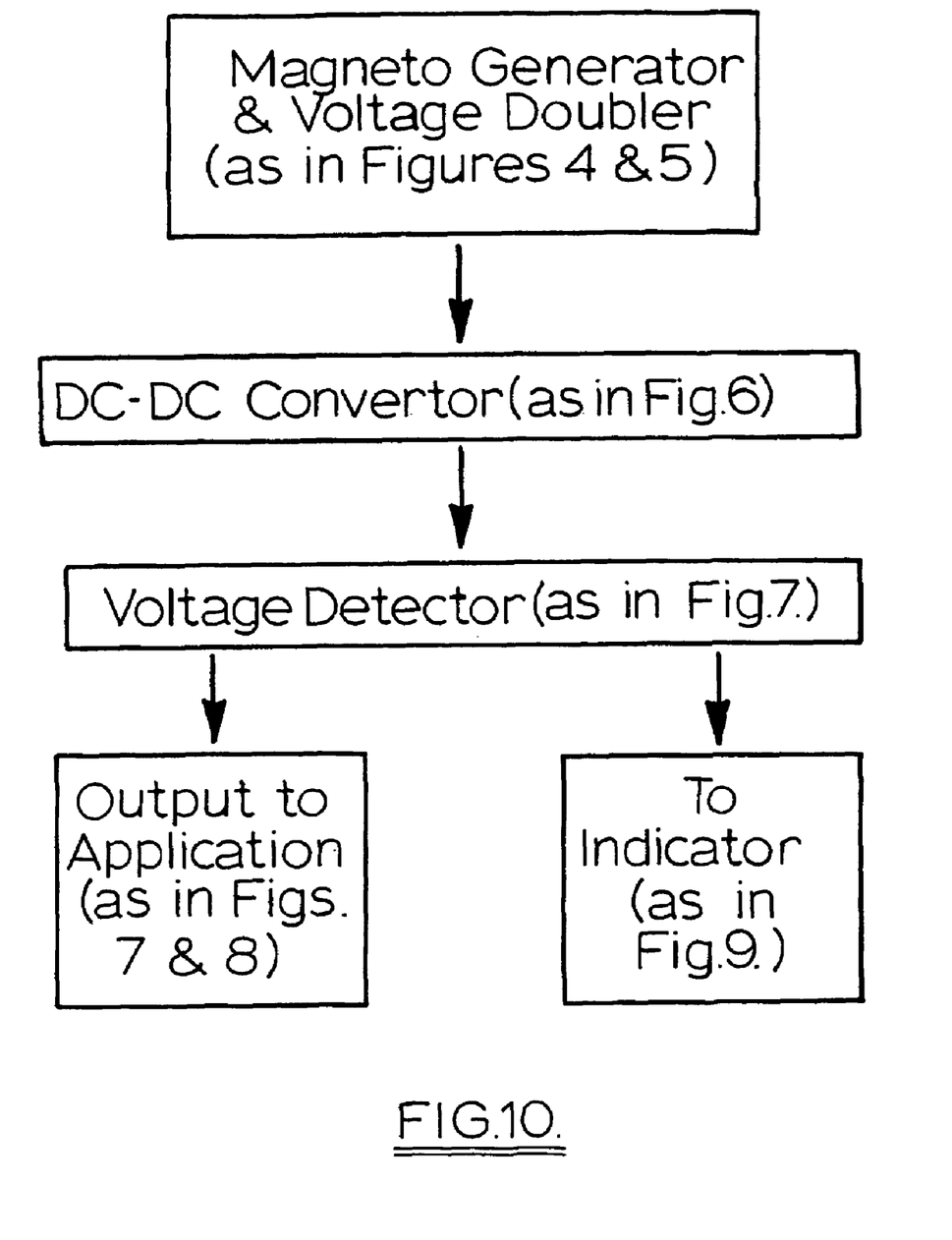
FIG. 10 is a high level schematic of all the modules.

3. Charge Indicator Module (see FIG. 9)

When operating the device it is preferable to have a visual indication of the operational status of the device. This is achieved by switching the voltage developed in one of the flexing PVDF (piezo) membranes through a neon bulb indicator. The switching is achieved by driving two MOSFET transistors from the voltage detector module (see FIG. 9). A little movement of the device will be enough to light up the bulb, and immediately indicate to the user the status of charge in the device.

Modules 1 and 2 increase the capability of the device to be used with almost any device. The third gives a visible indication when the device has enough energy to drive the particular application.

The embodiment of FIGS. 15–20 represents a physically smaller version of the invention with an output of 2 mW.

Parts 53 are magnets and are held in place locally by parts 42, 43, 54, and 48.

The magnet parts 53 adhere by magnetic attraction to the mu-metal part 53.

The magnets parts 53 are fixed inside a hollow section of part 54.

Figure 17:
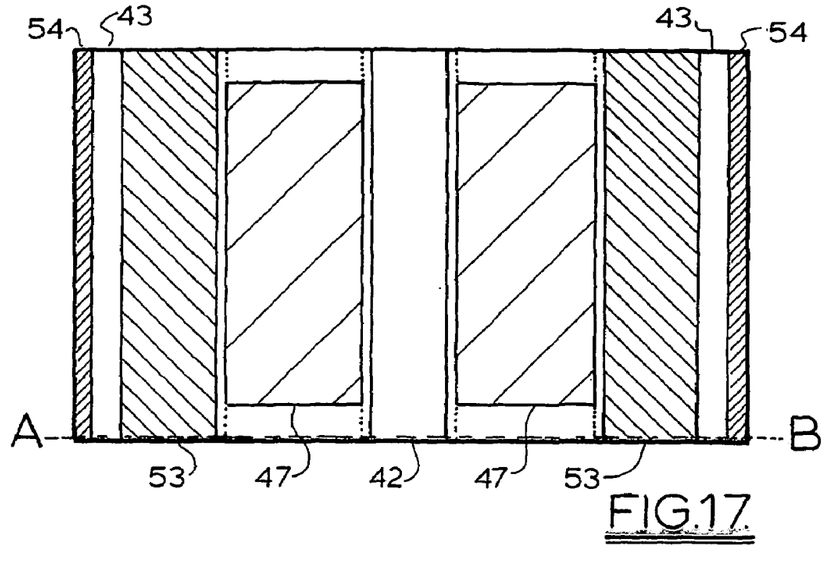
FIG. 17 shows the section plane A–B of FIG. 15.
Figure 18:
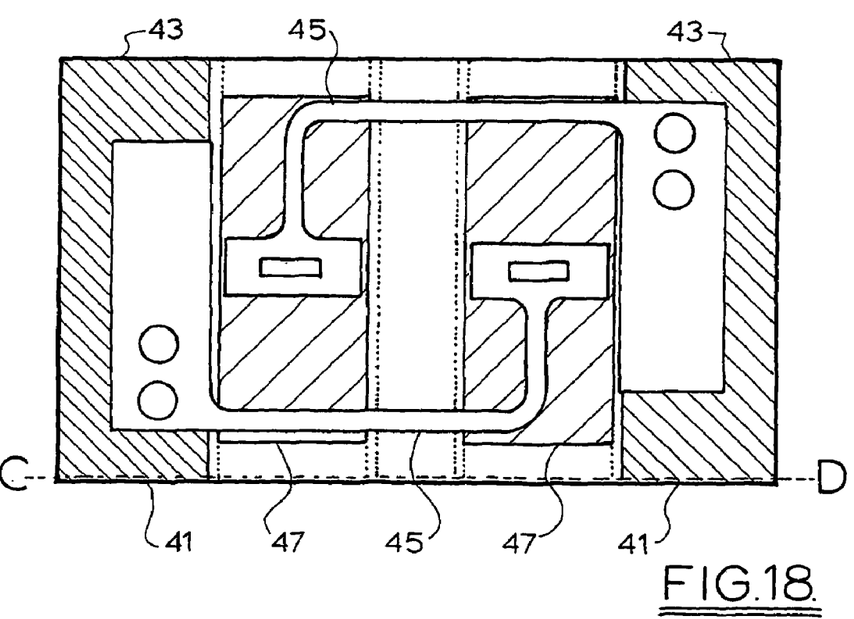
FIG. 18 shows the section plane C–D of FIG. 1.

All magnets are placed with their North Pole in the direction of the arrows in FIG. 17.

The placement and alignment of the magnets shown in FIG. 17 develop a strong non-linear magnetic flux density in the cavity between them.

Parts 45 are four stainless steel membranes that support the two coils 44 and the coil-caddies 47 in the cavity between the magnets.

Hollow plug fixings 46 attach the membranes 45, to the bobbin body 47. Spacers 41 and 46 fix the position and separate the membranes and are part of the main body of the device. The control electronics are surface mounted onto the printed circuit board 50. Parts 51 and 52 are brass screws.

Parasitic attachment to a moving object will force the coils and caddy in the device into random movement. The combined mass of the coils 44, caddy 47 together with the membranes 45 act as a mass—spring network, which is set into oscillation by the movement of the body. As with the previous embodiment this random movement may be in two of three component directions signified and the orientation of the mass spring network is very important for energy 'capture'. The membrane 45 has an 'L' shape as in the previous embodiment which allows energy capture in two directions x' and y' which ensures alignment with at least one major movement direction for any placement.

Figure 19:
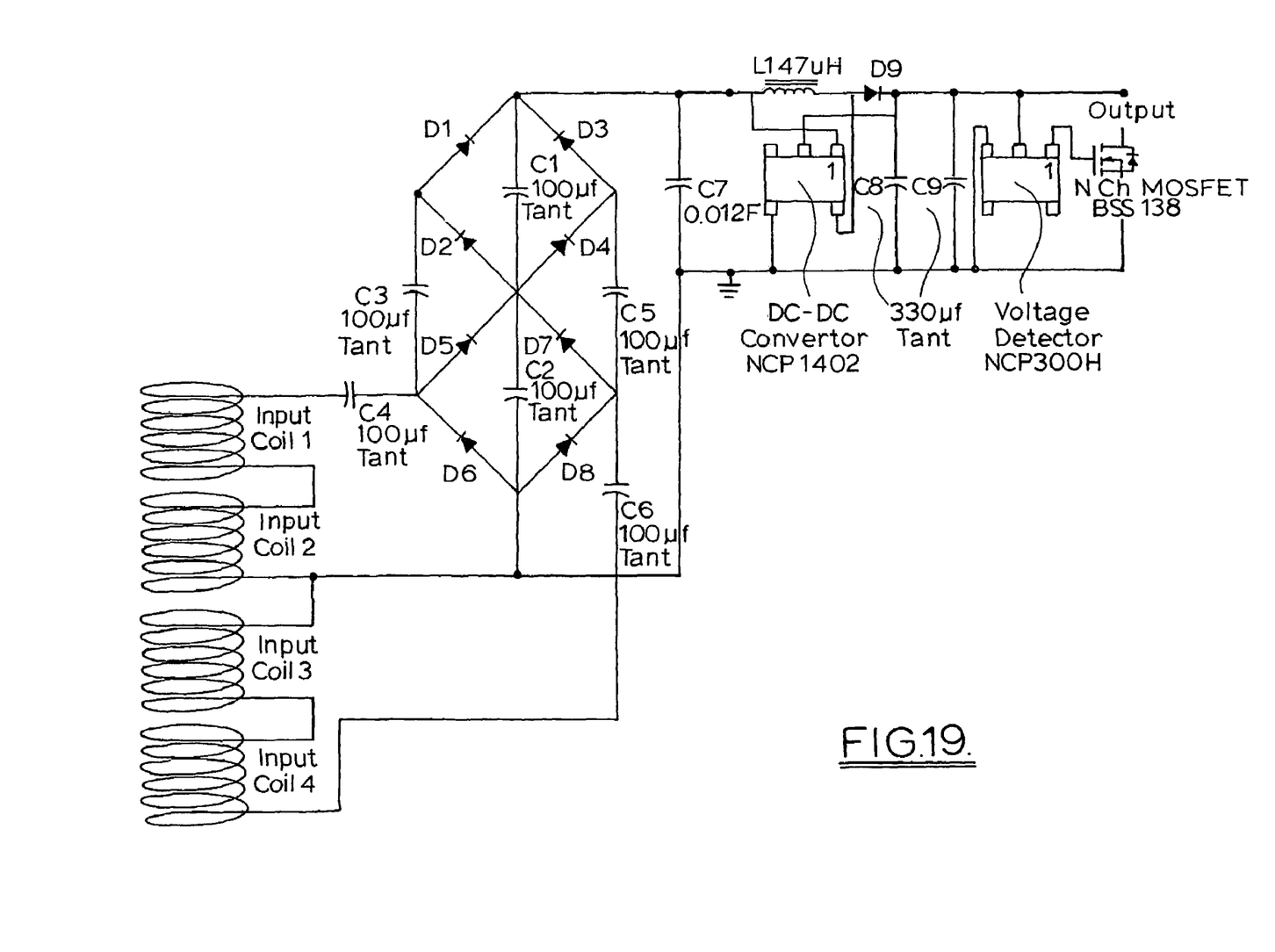
FIG. 19 is a schematic of the electronic circuit of the embodiment of FIGS. 15 to 16.

The circuit of FIG. 19 has a double voltage quadrupler multiplying the input voltage from the two independent oscillating coils. The rest of the circuit is as in the previous embodiment.

Figure 20:
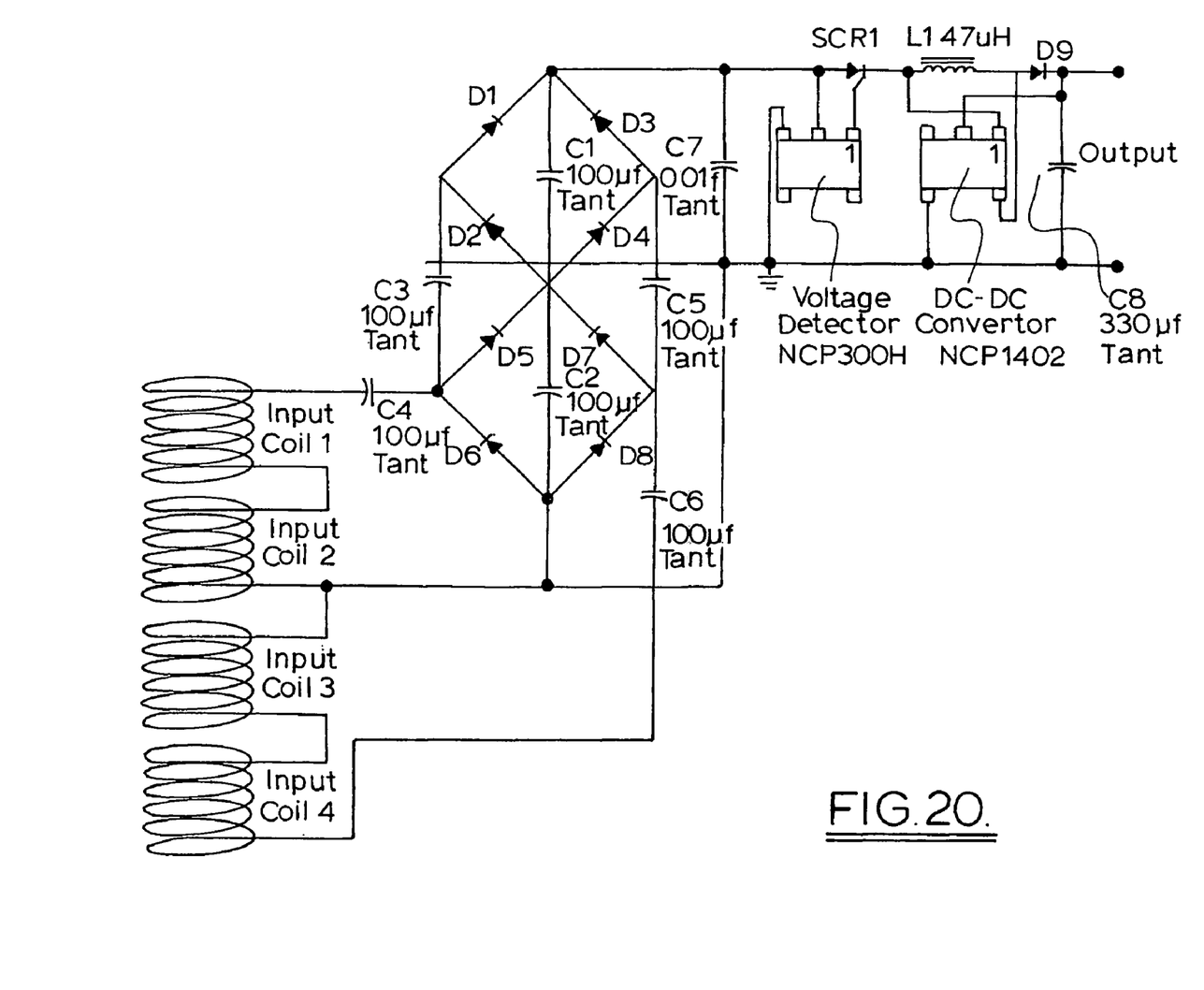
FIG. 20 is a schematic of an alternative to the electronic circuit shown in FIG. 19.

In the circuit of FIG. 20 the charge as is stored up in capacitor C7. When it has attained a specific voltage, the voltage detector turns on the sensitive gate SCR, which dumps the energy in the switch-mode DC-DC converter. This mode can be used to drive beacons, micro-controllers, sensors etc. within the applied duty cycle determined by the power rating of the application and the delivered output power (which is dependant on the excitation) of the device.

The device described has applications in powering remote key vehicle access and in many other areas including:

Inside the Human Body
  1. Recharging batteries

On Rotating Objects
  1. Heavy machinery crankshafts
  2. Turbines,
  3. Large gears,
  4. Mining industry On Reciprocating Objects
  1. Heavy machinery piston rods,
  2. pistons, 3. Packing machines
4. Process and plant operations
5. Robotics
6. Assembly lines
7. Crane hook and body stress analysis Wild Life and Stock Tracking
1. Powering animal active tagging and
2. animal tracking systems On Top of Liquids
1. Powering buoys,
2. Beacons,
3. emergency beacons,
4. military &
5. environmental sensors Within Liquids Such as
1. Molten plastic,
2. Setting concrete
3. Shark net power supplies,
4. Marine applications Structural Monitoring Such as
1. Within bridges,
2. Large machinery,
3. Generators,
4. Buildings,
5. Ships,
6. Rockets,
7. Aircraft and
8. Roads Environmental Monitoring Such as
1. Air Pollution monitoring in fields (i.e.: Attaching generator to the high branches of trees),
2. Air Pollution monitoring over (or water pollution within) lakes Commercial to the Public
1. Packing Magneto in standard battery type packages (e.g.: 'D' cell or 'Lantern')
2. Novelty toys for children or executive toys Shipping Container and Cargo
1. Active tagging and
2. Tracking monitoring Sport
1. Athlete (or player) sensor and location monitoring
2. Competition equipment sensor and location monitoring (e.g.: sculls, javelins etc)

From the above those skilled in the art will realise that this invention differs from previous attempts in Using moving coils and not moving magnets allowing for better shielding of the magnetic field lines.

Using a vibrating reed or membrane or pivoting rod array vibrating in two component directions to which a coil is attached.

Using a unique configuration of magnet geometry to optimise the magnetic flux in the path of the vibrating coils.

Using a vibrating reed or membrane to drive a switched neon indicator light to show the charge status of the device.

Having a passive operation meaning that it converts energy without any active input, ie there are no buttons to push nor is there any required shaking or direct activation of any kind. The device is attached to or placed into a receptacle that is attached to a moving object.

Those skilled in the art will realise that the present invention may be adapted for use in a range of applications and sizes and can be shaped to fit the requirements of the desired application.

The invention claimed is:

1. An electrical generator for harvesting energy from environmental vibrations or motion which includes
    a) an elongated support fixed at one end with the other end free to move or flex
    b) a coil with electric outputs secured to said elongated support remote from the fixed end
    c) a magnetic field adjacent the coil such that movement of the coil induces an electric current in the coil
    d) a piezo membrane incorporated in the elongated support so that the movement of the coil stresses the piezo membrane and generates a voltage that can be used to rectify the current produced in the coil.

2. An electrical generator as claimed in claim 1 in which there are several elongated supports of varying dimensions selected to provide a wider vibrational bandwidth.

3. An electrical generator as claimed in claim 1 in which the support is L shaped and fixed at the top with the coil mounted on the foot of the L.

4. An electrical generator as claimed in claim 1 in which the magnetic field is provided by permanent magnets which are configured to maximize the magnetic flux in the path of the moving coil.

5. An electrical generator as defined in claim 1, which incorporates a DC to DC voltage converter and a voltage detector.

6. A rectification device for a parasitic energy harvester in which vibration or motion induces relative movement between a coil and a magnet to induce an electric current in the coil in which a piezo electric membrane is incorporated into the support for either the magnet and/or the coil so that the vibration or motion also produces a voltage in the piezoelectric membrane sufficient to power the rectification of the voltage produced by the relative movement between the coil and the magnet.

7. A rectification device as claimed in claim 6 in which a coil is supported in the foot of an L shaped membrane secured for movement at the top of the L and the piezo membrane is positioned to be stressed by the movement of the membrane to produce a sufficient voltage to rectify the current produced in the coil.

* * * * *